United States Patent [19]

Westmoreland

[11] Patent Number: 5,227,331
[45] Date of Patent: Jul. 13, 1993

[54] CVD METHOD FOR SEMICONDUCTOR MANUFACTURE USING RAPID THERMAL PULSES

[75] Inventor: Donald Westmoreland, Boise, Id.
[73] Assignee: Micron Technology, Inc., Boise, Id.
[21] Appl. No.: 833,011
[22] Filed: Feb. 10, 1992
[51] Int. Cl.⁵ .................. H01L 21/283; H01L 21/324
[52] U.S. Cl. .................................. 437/174; 437/200; 437/245; 437/248
[58] Field of Search ............. 437/200, 245, 248, 172, 437/174; 148/DIG. 147, DIG. 71

[56] References Cited

U.S. PATENT DOCUMENTS

| | | | |
|---|---|---|---|
| 4,632,713 | 12/1986 | Tiku | 148/188 |
| 4,672,414 | 6/1987 | Gabriel | 357/34 |
| 5,011,789 | 4/1991 | Burns | 437/81 |

Primary Examiner—John S. Maples
Attorney, Agent, or Firm—Stephen A. Gratton

[57] ABSTRACT

A method of CVD deposition for semiconductor manufacture especially suited to the conformal deposition of a film into a semiconductor structure having deep wells and channels. The method includes directing rapid thermal pulses at the semiconductor structure. The thermal pulses heat the semiconductor structure and deposition gas stream to an optimal deposition temperature range. In between the thermal pulses the semiconductor structure and deposition gas stream cool and allow diffusion of the deposition gas stream into the recesses of the semiconductor structure. A frequency of the thermal pulses is from 1 to 100 Hz.

7 Claims, 1 Drawing Sheet

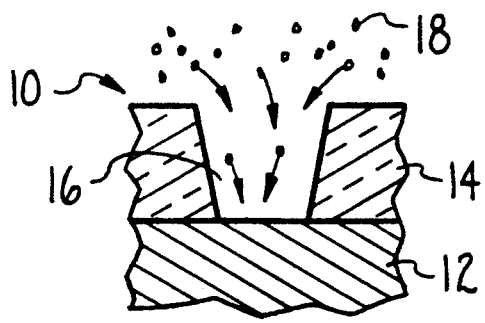
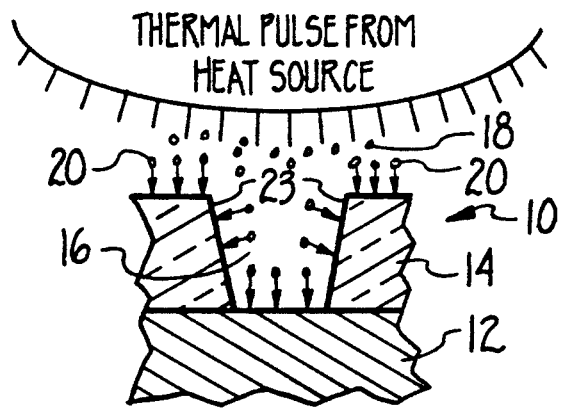
Fig.1A   Fig.1B
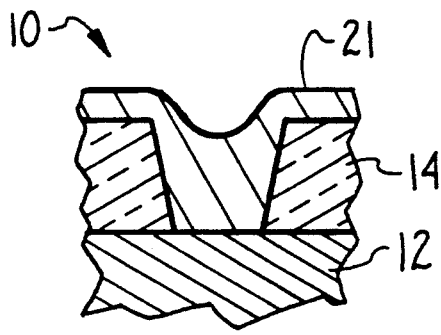
Fig.1C
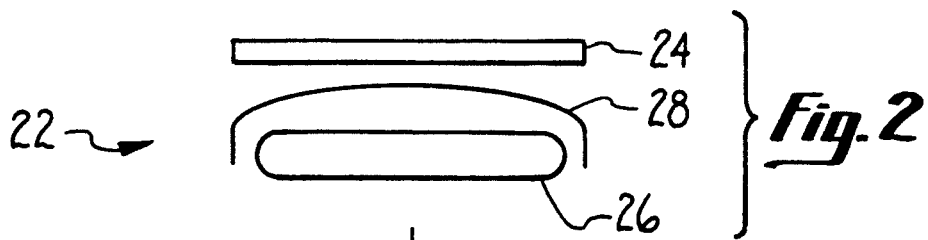
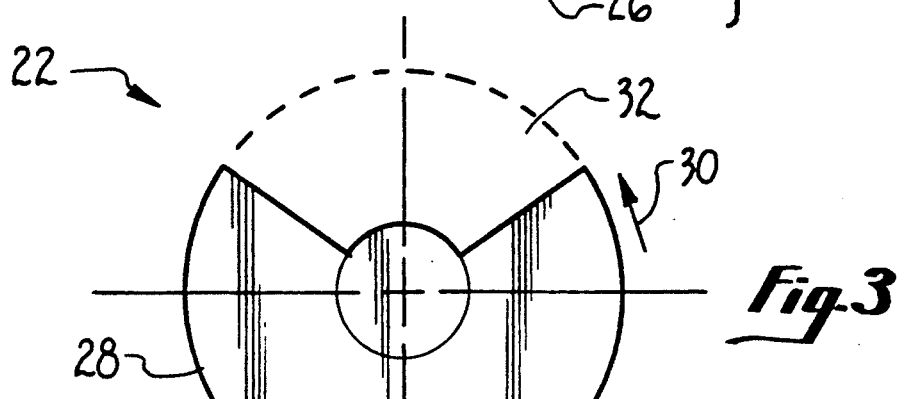
Fig.2
Fig.3

CVD METHOD FOR SEMICONDUCTOR MANUFACTURE USING RAPID THERMAL PULSES

FIELD OF THE INVENTION

This invention relates to semiconductor manufacture and more particularly to an improved method of chemical vapor deposition (CVD) using rapid thermal pulses.

BACKGROUND OF THE INVENTION

Microchip fabrication involves the formation of integrated circuits (ICs), on a semiconducting substrate. A large number of semiconductor devices or ICs are typically constructed on a wafer formed on a monolithic substrate of a single crystal silicon material. The semiconductor devices are formed by various processes such as doping and patterning the substrate and depositing various conducting or insulating layers of material on the substrate.

As silicon technology advances to ultra-large scale integration (ULSI), the devices on silicon wafers shrink to sub-micron dimension and the circuit density increases to several million transistors per die. In order to accomplish this high device packing density, smaller and smaller feature sizes are required. This may include the width and spacing of interconnecting lines and the geometry of various features. In order to achieve this geometry, conformal deposition processes are required.

As an example, the formation of contact/via holes in a semiconductor structure requires the conformal deposition of a film into a relatively deep trench or well-like structure. A film deposited into this structure with poor step coverage may adversely affect the completed semiconductor devices. Insufficient step coverage can lead to unreliable, high leakage and high resistivity contacts. This problem is magnified for ULSI applications where sub-micron high aspect ratio contact/via holes are required.

One deposition process that provides good step coverage in semiconductor manufacture is chemical vapor deposition (CVD). With CVD, gases for forming a film are mixed and reacted in a deposition chamber. The reaction forms the proper film elements or molecules in a vapor state. The elements or molecules then deposit on the wafer surface and build up to form a film. CVD reactions require the addition of energy to the system, such as heating the chamber or wafer. Some films require a narrow temperature range or process window for optimal deposition. In general CVD provides conformal step coverage because reactants or reactive intermediates diffuse rapidly along the substrate surface before reacting.

Various methods are known in the art for improving the step coverage of a CVD film. These methods include apparatus such as rotating holders that rotate the wafers at high speed so that the wafer is positioned at many angles to the deposition gas stream. In some systems, a plasma field is created in the reaction chamber to enhance the film deposition. The plasma adds additional energy to the reaction, resulting in more uniform depositions. An energy source for generating the plasma is typically provided by induction radio frequency (RF) waves.

It is also known to use pulsed RF waves to enhance the CVD process. The pulsed RF waves function to periodically energize the plasma above an optimal deposition energy level. Following the RF pulse, the energy of the plasma drops and diffusion of the reactant gases across the substrate occurs more easily. Such RF deposition processes require expensive and complicated equipment and procedures and ar limited to reactions that can be activated by RF energy.

Another prior art CVD process, U.S. Pat. No. 5,011,789 to Burns, uses heat pulses to heat the temperature of a substrate above 1000° C. for 15 to 90 seconds. This cleans the substrate and allows deposition of an epitaxial layer of silicon to begin. A limitation of this process is that it is directed to the epitaxial deposition of silicon and appears not to be suitable to the deposition of other types of films used in semiconductor manufacture.

The present invention is directed to an improved CVD method especially adapted to large scale semiconductor manufacture and to the deposition of a variety of materials. Accordingly it is an object of the present invention to provide an improved CVD process suitable for semiconductor manufacture. It is a further object of the present invention to provide an improved CVD process that is suitable for depositing films characterized by good step coverage in the formation of semiconductor structures. It is a further object of the present invention to provide a CVD process in which rapid thermal pulses are used to alternately deposit and diffuse a deposition gas over and into the deep recesses (i.e. wells, trenches) of a semiconductor structure.

SUMMARY OF THE INVENTION

In accordance with the present invention an improved CVD method for semiconductor manufacture is provided. The method of the invention, simply stated, uses rapid thermal pulses in which the thermal energy for driving the deposition process is alternately interrupted and activated. During interruption of the thermal energy, the deposition gas is allowed to diffuse thoroughly without premature deposition into the structure of the substrate. During activation of the thermal energy, deposition occurs and the deposition gas is depleted by deposition onto the substrate.

The method of the invention is particularly useful for the deposition of materials where deposition occurs or is optimized over a relatively narrow temperature range. The rapid thermal pulses can be adjusted such that the substrate temperature for deposition rapidly oscillates in and out of this deposition window.

A heat source for generating thermal pulses for practicing the method of the invention can include an inductive heating system similar to one used in rapid thermal processing (RTP). Such a heat source uses radiant energy to heat a semiconductor structure. Suitable heat sources include tungsten halogen lamps and graphite heaters. The radiation from the heat source couples into the semiconductor structure and quickly brings it and the deposition gas stream adjacent to the surface up to an optimal deposition temperature. With the process of the invention such a heat source would be cycled (i.e. ramped up and ramped down) on the order of about 1 to 100 Hz.

Another suitable heat source for generating thermal pulses includes a rotating beam interrupter apparatus that is placed between an infrared thermal source and the semiconductor structure. The heat source is directed at the semiconductor structure and is cycled by periodically blocking or interrupting the heat source with a rotating chopper element.

Other objects, advantages and capabilities of the present invention will become more apparent as the description proceeds.

BRIEF DESCRIPTION OF THE DRAWINGS

FIG. 1A is a schematic cross section of a semiconductor structure during a CVD process in accordance with the invention illustrating diffusion of reactants into the structure;

FIG. 1B is a schematic cross section of a semiconductor structure during a CVD process in accordance with the invention illustrating deposition of the reactants on the semiconductor structure during a heat pulse;

FIG. 1C is a schematic cross section of a semiconductor structure showing a film formed by a conformal deposition of the reactants;

FIG. 2 is a schematic side elevation view of an apparatus for applying a heat pulse during a CVD deposition process in accordance with the invention; and FIG. 3 is a plan view of the apparatus of FIG. 2.

DETAILED DESCRIPTION OF THE PREFERRED EMBODIMENT

As used herein the term thermal pulse refers to a short duration application of heat.

The method of the invention is directed to a CVD process for semiconductor manufacture in which rapid thermal pulses are used to heat the semiconductor structure and deposition gas stream in order to improve the conformability of a deposited film with the semiconductor structure. The method of the invention includes the steps of:

providing a semiconductor structure under fabrication;

placing the semiconductor structure in a CVD process chamber;

diffusing a deposition gas stream containing reactant gases and film molecules in a vapor state over the semiconductor structure; and directing rapid thermal pulses at the semiconductor structure and deposition gas stream such that the semiconductor structure and deposition gas stream are alternately heated for optimizing deposition of the film elements on the semiconductor structure and cooled for allowing the deposition gas stream to diffuse over and into the semiconductor structure.

In general with the method of the invention, each thermal pulse heats the deposition gas stream and semiconductor structure to a desired temperature. This temperature is selected to provide optimal conditions for deposition of the vapor film molecules onto the semiconductor structure. In addition, the concentration of the deposition gas stream in and around the semiconductor structure and especially in recesses of the semiconductor structure (i.e. wells, trenches, vias) is depleted. In the time between the thermal pulses, the deposition gas stream and semiconductor structure cool to a lower temperature and diffusion of the deposition gas stream into the semiconductor structure is allowed without premature deposition which would lead to poor conformality.

The method of the invention is shown schematically in FIGS. 1A–1C. A semiconductor structure 10 under fabrication includes a substrate 12 formed of a semiconducting material such as single crystal silicon wherein semiconductor devices are formed. An insulating layer 14 of a material such as silicon dioxide has been deposited on the substrate 12. Contact vias 16 are formed in the insulating layer 16 to the substrate 12 for contacting the semiconductor devices formed on the substrate 12. The contact vias 16 are recessed into the semiconductor structure as deep wells or trenches.

In this application it is necessary to conformally deposit a conducting material into the contact vias 16. As an example it may be desirable to conformally deposit tungsten silicide ($WSi_2$) into the vias 16 to form contact plugs. Such a conformal deposition can be accomplished by chemical vapor deposition (CVD) of a deposition gas stream 18 using a CVD reactor. The deposition gas stream 18 contains reactant gases which combine in the vapor state and deposit on the semiconductor structure. For depositing tungsten silicide ($WSi_2$) a silicon source gas, such as silane ($SiH_4$), can be reacted with a reactant gas, such as tungsten hexafluoride ($WF_6$) to form the tungsten silicide. These gases are introduced in stoichiometric amounts into the reaction chamber of the CVD reactor and with the addition of heat react to form tungsten silicide ($WSi_2$) molecules in the vapor phase. Under the influence of the heat and negative pressure the tungsten silicide ($WSi_2$) molecules are then deposited over the semiconductor structure 10 and into the via 16 to form a film 21 (FIG. 1C).

In accordance with the method of the invention a thermal pulse is directed at the semiconductor structure and deposition gas stream 18 in order to improve the deposition process. A cycle of operation may be described as follows. As shown in FIG. 1A, the deposition gas stream 18 initially diffuses over the semiconductor structure 10 and into the contact vias 16. While diffusion occurs continuously throughout the CVD process, an optimal diffusion of the deposition gas stream 18 into the via 16 takes place between the thermal pulses (i.e. the heat source is interrupted) because at this time actual deposition is at a minimum.

As shown in FIG. 1B, a thermal pulse is then directed at the semiconductor structure 10 and deposition gas stream 18. The thermal pulse heats the deposition gas stream and semiconductor structure 10 so that more film molecules are formed and deposited on the semiconductor structure 10. This improves deposition in the contact via 16 and on the sidewalls 23 thereof and depletes the concentration of the deposition gas stream 18 especially within the contact via 16.

Although deposition of molecules occurs continuously throughout the CVD process, optimal deposition activity occurs during heat input into the system by the thermal pulse. Following the short duration thermal pulse, the cycle is repeated and the deposition gas stream 18 again diffuses, as shown in FIG. 1 over the semiconductor structure 10 and into the via 16. As the cycle is repeated the film 21 is conformally deposited into the vias 16 of the semiconductor structure 10.

The frequency of the thermal pulses may be selected to achieve deposition over a relatively narrow temperature range. The temperature of the semiconductor structure will increase as the thermal pulse is applied (FIG. 1A). Conversely, the temperature of the semiconductor structure will decrease in the time period between thermal pulses and as the diffusion of the reactants increases (FIG. 1B). An optimal process window for deposition can thus be maintained.

Such a method is particularly suited to improving the deposition of reactant gases where optimal deposition occurs over a narrow temperature range. This temperature range can be tailored to the application and particularly to the reactant gases and film material. The frequency of the rapid thermal pulses can thus be selected as required. As an example the frequency may be between about 1 to 100 Hz.

In order to provide the thermal pulses, a heat source such as a graphite heater, or a tungsten arc or tungsten halogen lamp can be located within the reaction chamber of the CVD reactor. Such a heat source can be ramped up and ramped down at a desired frequency. The heat source is preferably directed at the semiconductor structure 10 for instantaneously increasing the surface temperature thereof. The deposition gas stream would also be heated by the heat source. The temperature of the deposition gas stream and semiconductor structure would thus rise with each thermal pulse to aid deposition of the vaporized molecules on the semiconductor structure and then drop in the time period between thermal pulses to allow diffusion of the deposition gas stream over and into recesses of the semiconductor structure.

The thermal pulses may also be provided by directing radiant energy from a heat source at the semiconductor structure and periodically interrupting the flow of radiant energy from the heat source. One suitable apparatus for performing this function is shown schematically in FIGS. 2 and 3. Such an apparatus can be described as a thermal chopper apparatus and is designated as 22.

The thermal chopper apparatus 22 includes a heat source 26. As before the heat source 26 may be some type of radiant heater such as a graphite heater or tungsten halogen lamp. The heat source 26 is directed at the semiconductor structure 24. A blocking means in the form of a shroud 28 is operatively associated with the heat source 26 to periodically block the flow of radiant energy from the heat source 26 to the semiconductor structure 24.

In order to provide this function, and as shown in FIG. 3, the shroud 28 is rotatably mounted about the heat source 26 to rotate in a direction as indicated by arrow 30. The shroud 28 has an interior surface formed of an energy blocking or reflective material. A cutout portion 32 is formed on the shroud 28 to periodically direct radiant energy from the heat source 26 at the semiconductor structure 24. As is apparent this permits a rapid thermal pulse to be directed at the semiconductor structure in accordance with the method of the invention.

Thus the invention provides a simple yet unobvious method for improving a CVD deposition process for semiconductor manufacture. Although the invention has been described with respect to preferred embodiments thereof, many variations and modifications will become apparent to those skilled in the art. It is therefore the intention that the appended claims be interpreted as broadly as possible in view of the prior art to include all such variations and modifications.

What is claimed is:

1. A method of CVD deposition in the fabrication of a semiconductor structure, comprising:

providing a semiconductor structure under fabrication;

placing the semiconductor structure in a CVD process chamber;

diffusing a deposition gas stream over the semiconductor structure;

directing thermal pulses at the semiconductor structure such that the semiconductor structure and deposition gas stream are alternatively heated by each thermal pulse to a temperature range for increasing deposition and cooled between thermal pulses to a temperature range for increasing diffusion of the deposition gas stream over the semiconductor structure, and forming the thermal pulses by directing a radiant heat source at the semiconductor structure and periodically interrupting the flow of radiant energy to the semiconductor structure with a thermal chopper apparatus having a rotating blocking means.

2. The method as claimed in claim 1 and wherein the frequency of the thermal pulse is from 1 to 100 Hz.

3. A CVD deposition method for semiconductor manufacture, comprising:

placing a semiconductor structure under fabrication in a CVD process chamber containing a deposition gas stream;

directing the deposition gas stream at the semiconductor structure for conformally depositing a film on the semiconductor structure;

directing rapid thermal pulses at the semiconductor structure at a frequency of 1 to 100 Hz such that a temperature of the semiconductor structure increases with each thermal pulse to provide an optimal temperature range for deposition and depletion of the deposition gas stream and the temperature of the semiconductor structure decreases between sequential thermal pulses to allow increased diffusion of the deposition gas stream into the recesses of the semiconductor structure; and forming the rapid thermal pulses by periodically blocking a flow of radiant energy from the heat source to the semiconductor structure using a rotating blocking means.

4. The method as recited in claim 3 and wherein the film is optimally deposited over a narrow temperature range and the temperature of the semiconductor structure rapidly oscillates into and out of this temperature range with each thermal pulse.

5. The method as recited in claim 3 and wherein the rotating blocking means includes a cutout portion that directs radiant energy from the heat source to the semiconductor structure.

6. The method as recited in claim 4 and wherein the CVD method is used to fill vias of a semiconductor structure with a deposited metal.

7. The method as recited in claim 4 and wherein the recesses in the semiconductor structure are deep wells or channels.

* * * * *